United States Patent
Wang et al.

(10) Patent No.: US 6,902,957 B2
(45) Date of Patent: Jun. 7, 2005

(54) METAL PROGRAMMABLE INTEGRATED CIRCUIT CAPABLE OF UTILIZING A PLURALITY OF CLOCK SOURCES AND CAPABLE OF ELIMINATING CLOCK SKEW

(75) Inventors: Hsin-Shih Wang, Fremont, CA (US); Shang-Jyh Shieh, Kao-Hsiung Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/249,745

(22) Filed: May 5, 2003

(65) Prior Publication Data

US 2004/0224443 A1 Nov. 11, 2004

(51) Int. Cl.$^7$ ................................................ H01L 21/82
(52) U.S. Cl. ...................................... 438/128; 438/129
(58) Field of Search ............................ 438/3, 6, 17, 45, 438/107, 110, 125, 128, 197, 250, 618, 132, 131, 130, 129; 365/230.03; 257/786; 713/500, 323, 320, 300; 711/170, 122; 710/315

(56) References Cited

U.S. PATENT DOCUMENTS 4,319,396 A * 3/1982 Law et al. ................... 438/128
6,312,980 B1 * 11/2001 Rostoker et al. ............. 438/197

* cited by examiner

*Primary Examiner*—Evan Pert
*Assistant Examiner*—Monica D. Harrison
(74) *Attorney, Agent, or Firm*—Winston Hsu

(57) ABSTRACT

A method for forming a metal programmable integrated circuit that can use a plurality of clock sources and balance clock skew. The integrated circuit has a semiconductor body. The method includes step (a) used for forming a plurality of basic units on the semiconductor body wherein each basic unit has at least a logic module, at least a driving module, and at least a storage module, and step (b) used for forming a metal layer for programming the logic module to be able to perform logic operations, programming the driving module to able to drive an input signal inputted into the driving module, and programming the storage module to be able to store data after performing step (a).

25 Claims, 11 Drawing Sheets

METAL PROGRAMMABLE INTEGRATED CIRCUIT CAPABLE OF UTILIZING A PLURALITY OF CLOCK SOURCES AND CAPABLE OF ELIMINATING CLOCK SKEW

BACKGROUND OF INVENTION

1. Field of the Invention

The present invention relates generally to a metal programmable integrated circuit and a related method for forming the metal programmable integrated circuit. More specifically, the present invention discloses a metal programmable integrated circuit capable of utilizing a plurality of clock sources and capable of eliminating clock skew and a related method for forming the metal programmable integrated circuit.

2. Description of the Prior Art

In the past, electronic components such as capacitors and resistors are electrically connected with the help of a rigid circuit board. However, semiconductor technology advances integrated circuits. That is, well-known electronic components are fabricated on one chip and the required traces connecting the well-known electronic components are implemented according to the same semiconductor technology.

Recently, the semiconductor technology process has developed to utilize a sub-micro process or a deep sub-micro process for reducing the width of each trace. Therefore, the total number of electronic components on the same chip increases when implementing a more complicated circuit. In the past, a system required many chips with appropriate connections to be capable of fulfilling a predetermined logic operation. However, with advances in the semiconductor process, different circuits can be fabricated on one chip. Therefore, different chips making up the system are integrated so that the total number of chips and total number of external wires are reduced.

For example, the well-known system on a chip (SOC) technology was developed to achieve an objective of using a single chip for implementing a system. However, an IC designer needs more efficient design methodology and powerful computer-aided design tools to accomplish such a complicated chip design successfully and correctly.

The development of integrated circuits accordingly boosts development of electronic products. For instance, the electronic components originally positioned on the circuit board are fabricated within the integrated circuit instead. Compared with a circuit board utilizing metal conductive wires (copper wires for example) to electrically connect two electronic components, the integrated circuit generally utilizes much shorter and much narrower traces to cut down internal parasite capacitance induced from the traces. Therefore, the circuit implemented by an integrated circuit works more accurately than that implemented by a rigid circuit board.

In addition, because many electronic circuits are capable of being integrated into the same integrated circuit, electronic products tend towards a smaller size and lighter weight. Besides, power dissipation and production cost are greatly reduced. Portable devices such as laptop computers and personal digital assistants are popular among consumers, further promoting the development of related portable devices.

Theoretically, the integrated circuit is capable of implementing any circuit on single chip with a small size. However, the size of each kind of integrated circuits differs. A digital integrated circuit has the lowest power dissipation so that the density of the electronic components is greatly improved. Other types of integrated circuits such as analog integrated circuits and radio frequency integrated circuits have higher power dissipation or have wires with turning points that will dissipate power while transmitting high-frequency signals. Therefore, concerning heat radiation or signal transmission, the density of the electronic components is limited for certain kinds of integrated circuit.

In addition, with improvements in circuit design, analog circuits with low power dissipation and high processing speed are capable of being integrated with digital circuits to form mixed-mode integrated circuits. From the above description, the integrated circuits are widely used in all kinds of electronic products, and how to design traces between electronic components inside the integrated circuit has become an important issue.

Because the scale of an integrated circuit expands with the development of semiconductor process, it is difficult for an engineer to handle overall chip manufacturing for a very-large-scale integrated circuit (VLSI). A manufacturing process of the integrated circuit is divided into a semiconductor process, a photomask design, a component test, etc. A well-known pattern independent principle discloses that photomask design and the actual semiconductor process are separated. Geometric allocation of components and traces is designed according to limitations (an allowable spacing width for example) in the applied semiconductor process. That is, the pattern design for the photomask is processed according to well-known design rules. Therefore, the integrated circuit designer does not need to understand the detailed procedures of the semiconductor process when designing any chip composed of integrated circuits.

Similarly, the semiconductor foundry also does not need to understand the detailed functions of the integrated circuit when manufacturing the integrated circuit. With the use of the design rules, the integrated circuit design is isolated from the semiconductor process to simplify the overall manufacturing process of the integrated circuit. In other words, the workload for the integrated circuit designer and that for the chip manufacturer is reduced. If both the integrated circuit designer and the chip manufacturer comply with the same design rules, the manufacture of the chip composed of integrated circuits will correspond to an acceptable yield.

The electronic products nowadays generally adopt application specific integrated circuits (ASICs) to support more functions and to lower production cost. For example, the computer peripheral devices such as hard-disk drives and scanners have application specific integrated circuits installed on the corresponding circuit boards. One objective of the application specific integrated circuit is to integrate required circuits more efficiently, and another objective is to protect aninnovative circuit design from being easily copied by competitors. However, prototype development is a bottleneck when manufacturing the specific integrated circuit.

Recently, people are eagerly searching for a method of quickly developing a prototype used for verifying functions of the designed application specific integrated circuit and debugging the application specific integrated circuit. Therefore, the time-to-market related to the application specific integrated circuit is shortened to improve corresponding competitiveness. The design methodology for the integrated circuits includes a full-custom design, a gate array design, and a standard cell design.

The full-custom design means that the circuit layout design starts from designing fundamental transistors. The integrated circuit designer has to design sizes of components, locations of components, and connections between components in person. This kind of design methodology is capable of acquiring the best performance from the integrated circuit (higher processing speed and lower power dissipation) and greatest component density (smaller chip size). In addition, production cost is accordingly low owing to the smaller chip size. However, the full-custom design requires the most efforts of the integrated circuit designer, and takes a longer period of lead-time.

The standard cell design and the gate array design are respectively used to moderately simplify the design complexity. The standard cell design uses commonly used function blocks pre-defined by a cell library to build a large-scale circuit. Therefore, the main job of the integrated circuit designer is design placement of the function blocks and routing between the function blocks. The cell library is composed of previously developed small-scale circuits. Because functions related to small-scale circuits defined in the cell library have been verified during a previous development process of the small-scale circuits, the combinational large-scale circuit has a great possibility of a correct function and a great yield. In addition, with less efforts spent on the overall circuit design, the lead-time is accordingly shortened.

The principle drawback is that each function block corresponds to a specific structure. Therefore, when many function blocks are formed on the same wafer, each function block requires a unique photomask pattern design. That is, more photomask layers are used to manufacture the function block. In addition, the photomask pattern design for one function block may not be compatible with another function block so that the production cost of the chip is greater. Besides, it is difficult to greatly reduce overall chip size because each function block corresponds to a specific geometric shape.

With regard to the gate array design, a semiconductor foundry provides fixed-size standard transistors and an allowable spacing width between traces. The semiconductor foundry only manufactures standard transistors, that is, a semi-finished production of the chip, which is only composed of a transistor array without metal traces. Therefore, the integrated circuit designer can design traces routing among the standard transistors according to hardware specifications related to the standard transistors. In other words, the principle job of the integrated circuit designer is to program the photomask patterns related to upper metal layers of the integrated circuit. Then, the designed photomask patterns are transferred to the semiconductor foundry for further forming the metal layers to accomplish routing traces among the transistors. In the end, the chip composed of the integrated circuit is generated from the semiconductor foundry. As mentioned above, because each transistor corresponds to the same hardware specification, the photomask pattern is capable of being re-used for forming the transistors so that the photomask cost is greatly lowered.

Please refer to FIG. 1, which is a diagram showing a prior art semiconductor body 10 of an integrated circuit. The semiconductor body 10 has a plurality of functional circuit cells 12. The functional circuit cells 12 are arranged row-by-row or column-by-column according to an array format to finally form a matrix format. It is well-known that the matrix format corresponds to a minimum chip size. That is, the allocation of the functional circuit cells 12 corresponds to a maximum component density.

The semiconductor body 10 is divided into synchronous regions 14a, 14b and a non-synchronous region 16. All of the functional circuit cells 18a, 18b within the synchronous regions 14a, 14b operate according to a clock signal. For example, each of the functional circuit cells 18a, 18b respectively functions as a flip-flop, a latch, or a clock buffer after being defined by a corresponding routing design. On the other hand, the functional circuit cells 20 within the non-synchronous region 16 are not driven by clock signals.

Each functional circuit cell 20 is capable of performing a predetermined logic operation after being defined by a corresponding routing design. For example, each of the functional circuit cells 20 respectively functions as an AND logic gate circuit, an OR logic gate circuit, or an XOR logic gate circuit. According to the gate array design, It is noteworthy that maker of the semiconductor body 10 (the semiconductor foundry for example) does not form any traces routing among the functional circuit cells 12 in the beginning. In other words, connections between contacts of the functional circuit cells 12 are defined according to the photomask patterns programmed by the integrated circuit designer.

After the integrated circuit designer hands over the designed photomask patterns to maker of the semiconductor body 10, upper metal layers are then formed on the semiconductor body 10 based on the photomask patterns. For instance, a first metal layer and a second metal layer are formed on the semiconductor body 10 to place traces routed among the functional circuit cells 12 so that the integrated circuit is capable of correctly performing a predetermined operation. In addition, global traces such as clock traces and power traces are implemented by a third metal layer.

Please refer to FIG. 1 in conjunction with FIG. 2. FIG. 2 is a diagram showing traces routed within the synchronous regions 14a, 14b. In the synchronous region 14a, a clock trace 22a vertically crosses each functional circuit cell 18a of the synchronous region 14a. In addition, two power traces 24a, 26a also cross each functional circuit cell 18a of the synchronous region 14a. The power traces 24a, 26a are respectively used to provide operating voltages (a high voltage level Vdd and a low voltage level Vss for example) required by each functional circuit cell 18a. Similarly, a clock trace 22b and two power traces 24b, 26b vertically cross each functional circuit cell 18b of the synchronous region 14b. As shown in FIG. 2, power traces 24a, 24b, 26a, 26b are respectively located at both sides of the clock traces 22a, 22b so that noise transmitted by the clock traces 22a, 22b interfering with the clock signals is reduced. In other words, clock skew related to the clock signal is lessened.

Because the functional circuit cells 18a, 18b requiring clock signals to function properly are confined to the synchronous regions 14a, 14b, the clock traces 22a, 22b are only positioned within the synchronous regions 14a, 14b. That is, a clock tree corresponding to the semiconductor body 10 is simplified. With proper allocation of the synchronous regions 14a, 14b and the non-synchronous region 16 within the semiconductor body 10 of the prior art integrated circuit, power dissipation and clock skew related to the clock signals transmitted by the clock traces 22a, 22b is then reduced.

Generally speaking, delay time of a signal transmitted by any transmission path within the prior art integrated circuit includes two factors. One factor is a gate delay generated from logic gates, and another factor is a wire delay generated from the length of traces. The two factors respectively correspond to different contributions to the delay time according to the adopted semiconductor process.

With regard to the micro process, the wire delay is negligible. However, with regard to the sub-micro process, size of the electronic component is greatly reduced to lower corresponding gate delay. On the other hand, the wire delay is increased because the width of the trace is narrowed to accordingly increase resistance of the trace. Comparing the wire delay and the gate delay, the wire delay generated from the rising resistance of the trace cannot be neglected anymore. Therefore, the clock skew of the clock traces 22a, 22b needs to be carefully considered.

As mentioned above, the semiconductor body 10 of the prior art integrated circuit is divided into synchronous regions 14a, 14b and a non-synchronous region 16. The functional circuit cells 18a, 18b, driven by the clock signals, are distributed in the synchronous regions 14a, 14b. That is, the prior art has to consider clock balance for controlling clock skew according to the geometric distribution of the synchronous regions 14a, 14b within the semiconductor body 10. However, based on the prior art semiconductor body 10, the geometric distribution of the synchronous regions 14a, 14b corresponds to a predetermined allocation of clock traces 22a, 22b. As shown in FIG. 2, the clock traces 22a, 22b vertically cross all of the functional circuit cells 18a, 18b located at the synchronous regions 14a, 14b. Therefore, the integrated circuit designer has to adopt a fixed amount of clock sources according to the geometric distribution of the synchronous regions 14a, 14b. In other words, the prior art semiconductor body 10 does not allow the integrated circuit designer to adopt any wanted amount of clock sources for the sake of clock balance. To sum up, the application field of the semiconductor body 10 is limited by the geometric distribution of the synchronous regions 14a, 14b.

SUMMARY OF INVENTION

It is therefore a primary objective of this invention to provide a metal programmable integrated circuit and a related method for forming the integrated circuit so that the integrated circuit is capable of utilizing a plurality of clock sources and capable of eliminating clock skew.

Briefly summarized, the preferred embodiment of the claimed invention discloses a method for forming an integrated circuit. The integrated circuit has a semiconductor body. The method includes forming at least a logic operation module, at least a driver module, and at least a storage module within each of a plurality of basic units positioned on the semiconductor body, and forming a metal layer upon the semiconductor body for programming the logic operation module to be capable of performing a predetermined logic operation, for programming the driver module to be capable of driving input signals inputted into the driver module, and for programming the storage module to be capable of storing data.

It is an advantage of the claimed invention that each basic unit has at least a driver module capable of being programmed to function as a clock driver for adjusting the timing of clock signals. That is, the integrated circuit designer programs the driver module to eliminate the prior art clock skew. Therefore, the amount of clock sources used by the integrated circuit, which is fabricated based on the claimed semiconductor body, is not limited. The claimed semiconductor body is capable of being applied to design any integrated circuit so that the claimed semiconductor body corresponds to greater design flexibility and a broad application field.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
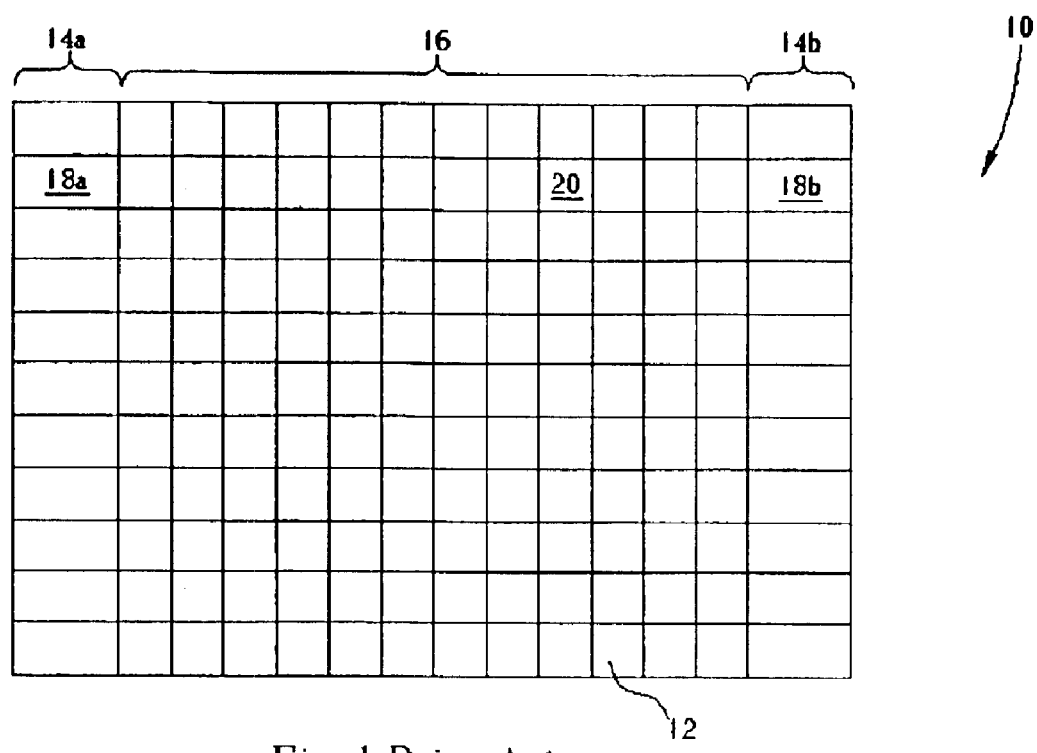
FIG. 1 is a diagram showing a prior art semiconductor body of an integrated circuit.
Figure 2:
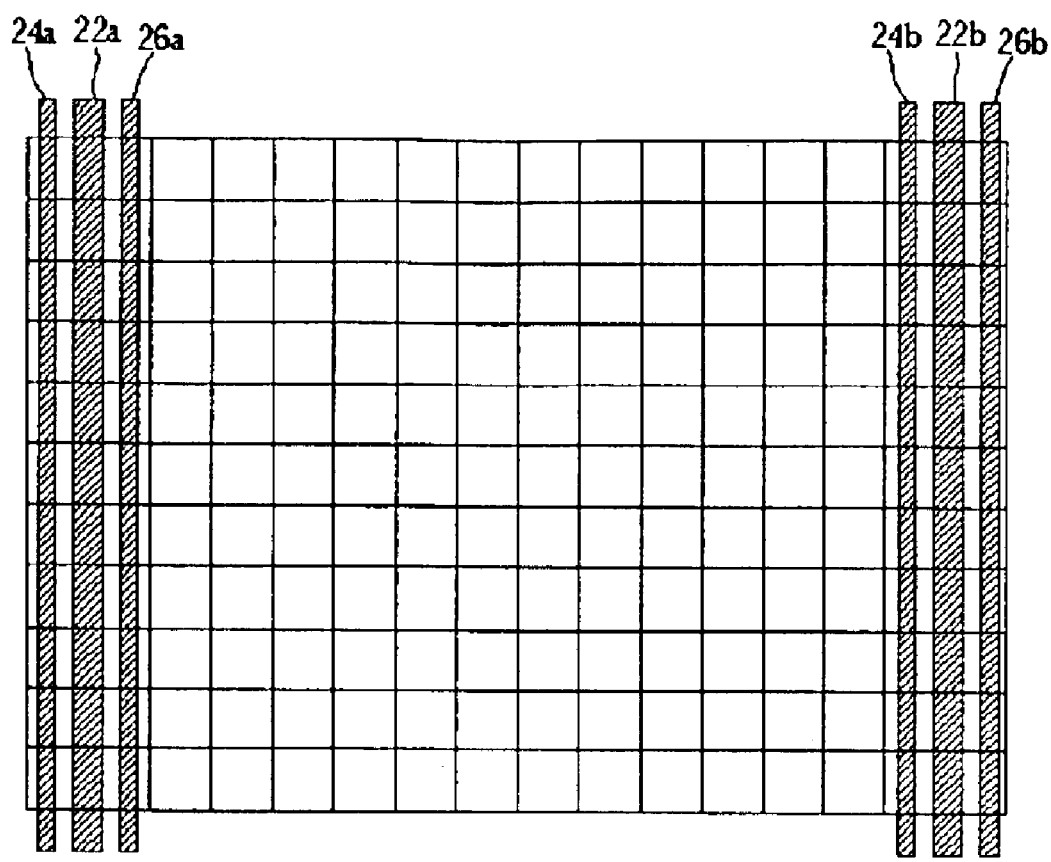
FIG. 2 is a diagram showing traces routed within the synchronous regions shown in FIG. 1.
Figure 3:
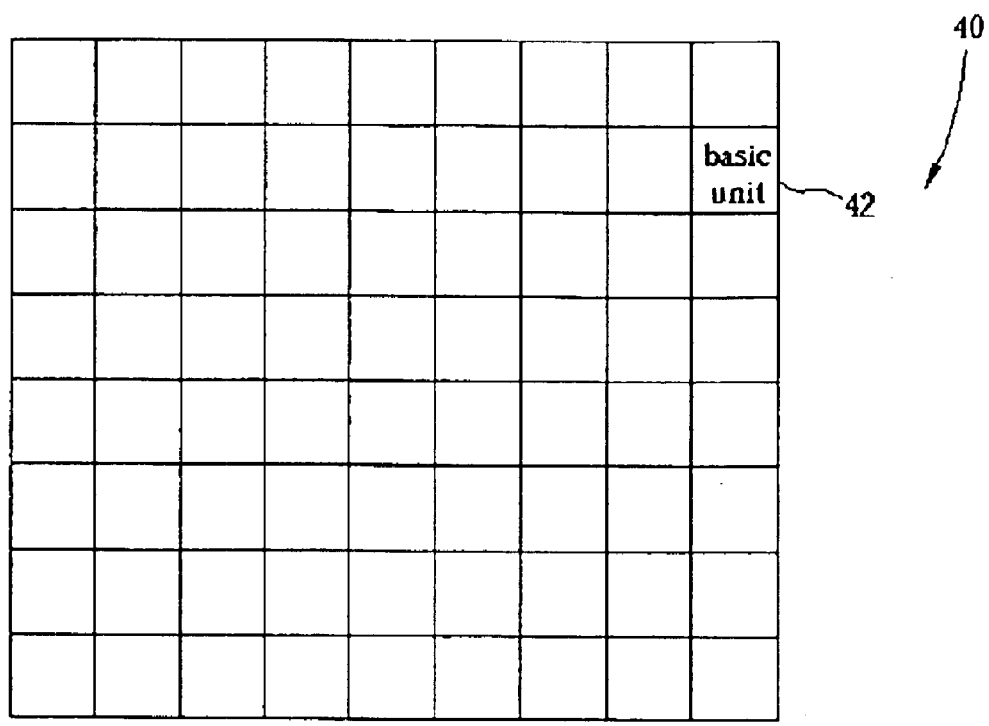
FIG. 3 is a diagram showing a semiconductor body according to the present invention.

Please refer to FIG. 3, which is a diagram showing a semiconductor body 40 according to the present invention. The semiconductor body 40 has a plurality of basic units 42. In the preferred embodiment, the basic units 42 are positioned on the semiconductor body 40 according to a matrix format for acquiring greater density. In other words, the area required to accommodate the basic units 42 is reduced to further shrink size of the corresponding integrated circuit. However, the basic units 42 can be position on the semiconductor body 40 according to other arrangements. For example, the basic units 42 are positioned in the same row or in the same column to be an array.

A semiconductor foundry fabricates the semiconductor body 40 in advance. An integrated circuit designer is then capable of designing photomask patterns for traces routed among the basic units 42. In the end, according to the photomask patterns designed by the integrated circuit designer, the semiconductor foundry forms at least a metal layer upon the semiconductor body 40 to position conductive wires routed among the basic units 42. With the help of conductive wires, each basic unit 42 is capable of performing a predetermined function, and the corresponding integrated circuit then works correctly according to design made by the integrated circuit designer.

Figure 4:
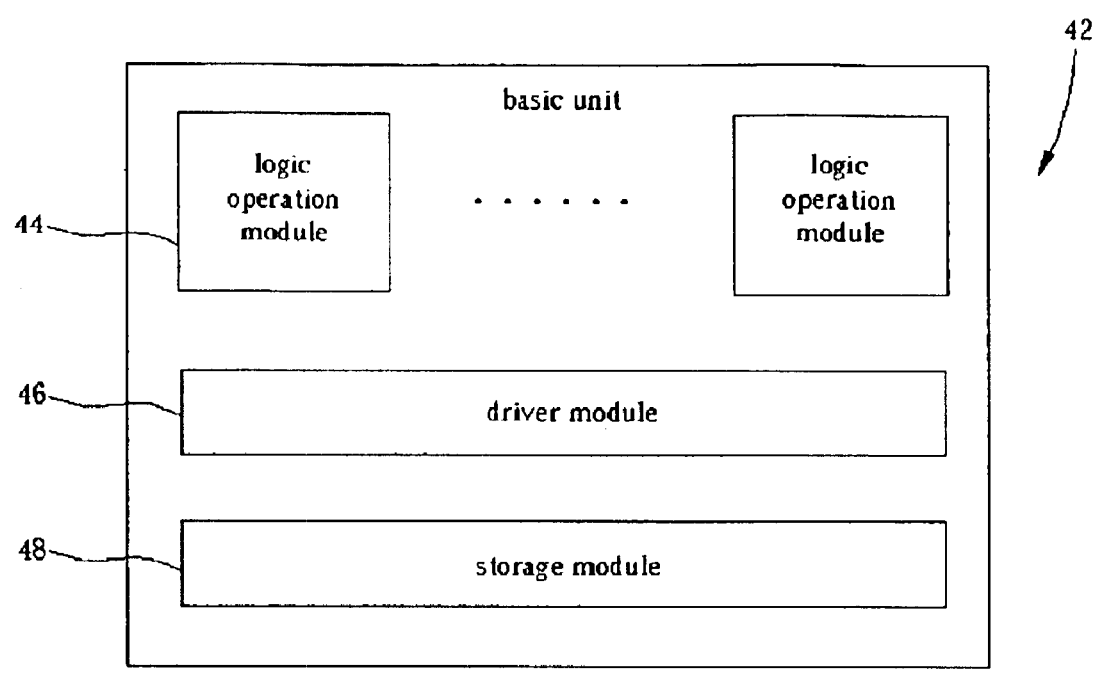
FIG. 4 is a block diagram of a basic unit shown in FIG. 3.

Please refer to FIG. 4, which is a block diagram of the basic unit 42 shown in FIG. 3. The basic unit 42 has a plurality of logic operation modules 44, a driver module 46, and a storage module 48. In the preferred embodiment, the logic operation module 44 is used to perform a logic function. The storage module 48 is used to store data. The driver module 46 is used to drive a predetermined signal such as a data signal or a clock signal. That is, the driver module 46 is capable of driving the data signal or the clock signal toward the logic operation module 44 or the storage module 48. The driver module 46 is capable of driving calculation results outputted from the logic operation module 44 or data stored in the storage module 48 toward another logic operation module 44 or another storage module 48 within the same basic unit 42. In addition, the driver module 46 is capable of driving calculation results outputted from the logic operation module 44 or data stored in the storage module 48 toward another logic operation module 44 or another storage module 48 located in a different basic unit 42.

Figure 5:
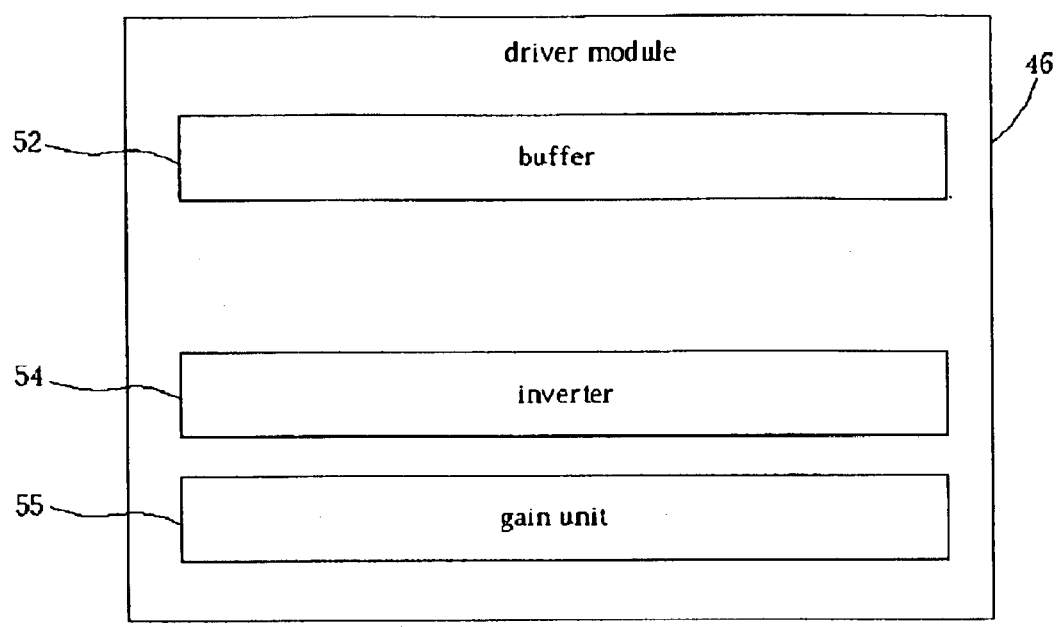
FIG. 5 is a block diagram of a driver module shown in FIG. 4.

Please refer to FIG. 5 in conjunction with FIG. 4. FIG. 5 is a block diagram of the driver module 46 shown in FIG. 4. The driver module 46 includes a buffer 52, an inverter 54, and a gain unit 55. The buffer 52 or the inverter 54 is used to receive signals, and the gain unit 55 is used to drive the signals received by the buffer 52 or the inverter 54 according to a predetermined gain value. For example, the buffer 52 can be a voltage follower used to drive an electronic component connected to an output port of the buffer 52. The inverter 54 is used to invert an input signal for generating an output signal so that the input signal and the output signal correspond to different logic values, and the inverter 54 drives an electronic component connected to an output port of the inverter 54. The gain unit 55 is capable of being electrically connected to either the buffer 52 or the inverter 54 for providing the buffer 52 or the inverter 54 with different driving capacity. For example, the gain unit 55 is capable of providing 4 different gain values 1×, 2×, 3×, 4×.

It is noteworthy that the semiconductor foundry forms electronic components related to the buffer 52, inverter 54, and the gain unit 55 within the driver module 46 in advance, and then the integrated circuit designer is capable of using one photomask to quickly set up traces routed within the driver module 46. That is, the driver module 46 is defined to enable either the buffer 52 or the inverter 54, and the driver module 46 is also defined to adopt one driving capacity provided by the gain unit 55.

For instance, perhaps the integrated circuit designer designs the driver module 46 to function as a repeater. That is, the buffer 52 is electrically connected to the gain unit 55 with a gain value equal to 1× after the required traces routed between the buffer 52 and the gain unit 55 are finally positioned upon the semiconductor body 40. Therefore, the driver module 46 is used to relay an input signal to prevent the input signal from being decayed owing to a long transmission distance.

As mentioned above, the driver module 46 is capable of driving a data signal or a clock signal, and the driver module 46 corresponds to different driving capacities according to design made by the integrated circuit designer. Therefore, the driver module 46 in the preferred embodiment can be used to handle prior art clock skew to achieve clock balance. That is, the driver module 46 can be designed to function as a delay cell for adjusting timing of clock signals.

For instance, two logic operation modules 44 respectively positioned in different basic units 42 are designed to function as clock-gating circuits. If the transmission paths between clock-gating circuits and a common clock generator outputting clock signals corresponds to different distances, it is obvious that prior art clock skew is introduced when the clock signal drives these two clock-gating circuits. In other words, when the clock generator outputs the clock signal with a level transition from "0" to "1" or from "1" to "0", the clock signal should simultaneously enable one clock-gating circuit and disable another clock-gating circuit at a predetermined timing. However, when the clock signal drives the two clock-gating circuits, the clock skew occurs because of different transmission paths. Therefore, both of the clock-gating circuits may be enabled or disabled during the same period of time and the integrated circuit probably malfunctions to output wrong results.

In the preferred embodiment, the driver module 46 is used to adjust the clock signals so that the clock skew is prevented from affecting timing of the clock signals. In addition, the basic units 42 as shown in FIG. 3 are distributed on the semiconductor body 40, and each basic unit 42 has a driver module 46 that is capable of functioning as a clock driver to adjust timing of the clock signals. In other words, because the semiconductor body 40 has driver modules 42 that can be designed to be clock drivers, the semiconductor body 40 is unlike the prior art semiconductor body 10 that needs to limit amount of clock sources for successfully achieving clock balance. That is, the semiconductor body 40 according to the present invention can use an unlimited amount of clock sources and has no limit on transmission paths routed within the semiconductor body 40. With the help of the driver module 46, the clock balance is easily achieved. Therefore, the integrated circuit designer can design the integrated circuit capable of being driven by a plurality of clock sources. The semiconductor body 40 according to the present invention provides the integrated circuit designer with great design flexibility to design integrated circuits. To sum up, the semiconductor body 40 corresponds to a broad application field and has improved market competitiveness.

Figure 6:
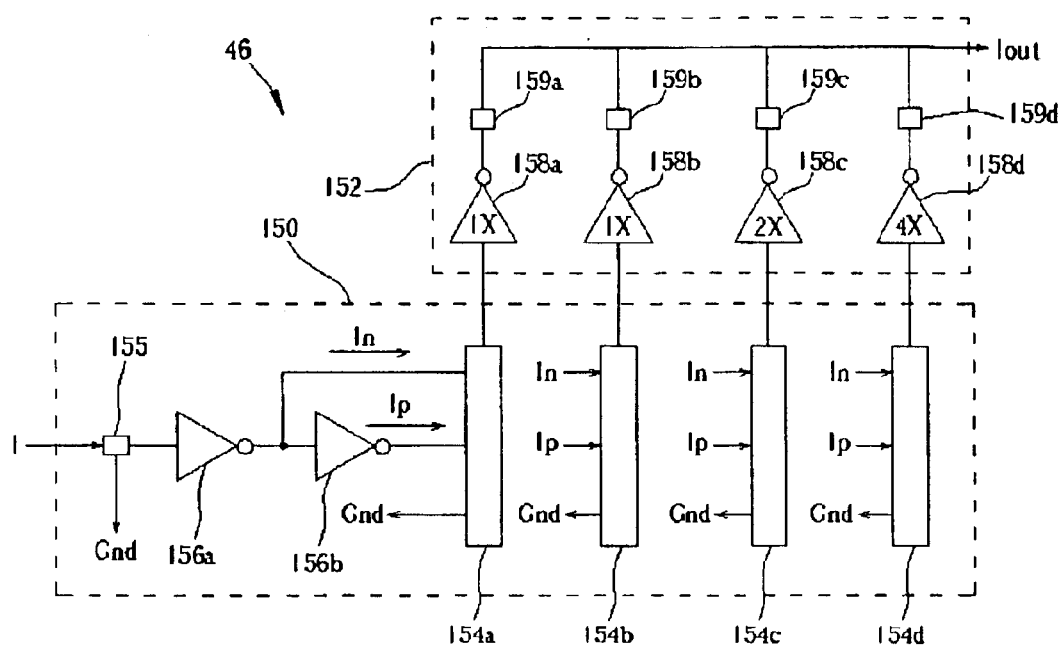
FIG. 6 is a first circuit diagram of the driver module shown in FIG. 4.

Please refer to FIG. 6, which is a first circuit diagram of the driver module 46 shown in FIG. 4. The driver module 46 has an input circuit 150 and an output circuit 152. The input circuit 150 has a plurality of nodes 154a, 154b, 154c, 54d, 155, and two inverters 156a, 156b. The node 155 is used to determine whether an input signal I or a ground voltage Gnd is inputted into the inverter 156a. The inverters 156a, 156b are used to generate output signals In, Ip with opposite logic values. For example, if the node 155 is designed to transmit the input signal I to the inverter 156a, the output signal In and the input signal I correspond to the same logic value, but the output signal Ip and the input signal I correspond to opposite logic values. Nodes 154a, 154b, 154c, 154d are respectively used to determine whether the output signal In, the output signal Ip, or the ground voltage Gnd is inputted into the corresponding driving units 158a, 158b, 158c, 158d of the output circuit 152. In addition, the output circuit 152 further has a plurality of nodes 159a, 159b, 159c, 159d used to determine whether output ports of the driving units 159a, 159b, 159c, 159d are used to drive an output signal Iout.

In the preferred embodiment, each driving unit 158a, 158b, 158c, 158d individually corresponds to a driving capacity 1×, 1×, 2×, 4×. For example, when a voltage level is inputted into the driving unit 158a, a corresponding driving current. Id is outputted from the driving unit 158a. If the same voltage level is inputted into the driving unit 158d, the driving current outputted from the driving unit 158d becomes 4* Id. Therefore, the driver module 46 functions as a buffer with a predetermined driving capacity or an inverter with a predetermined driving capacity through appropriately programming the nodes 154a, 154b, 154c, 154d.

For instance, suppose the node 155 is programmed to let the input signal I be inputted into the inverter 156a, the node 159d is programmed to let an output port of the driving unit 158d be capable of driving the output signal Iout, and the node 154d is programmed to make the output signal Ip drive the driving unit 158d of the output circuit 152. Then, the driver module 46 functions as an inverter with a 4×driving capacity.

On the other hand, the node 159d may be programmed to let the output port of the driving unit 158d be capable of driving the output signal Iout, and the node 154d programmed to make the output signal In drive the driving unit 158d of the output circuit 152. Then, the driver module 46 functions as a buffer with a 4×driving capacity.

In addition, the output port of each driving unit 158a, 158b, 158c, 158d can be superposed to alter the overall driving capacity of the driver module 46. For example, the node 159c, 159d are programmed to let the output ports of the driving units 158c, 158d be capable of driving the output signal Iout, and the nodes 154c, 154d are programmed to make the output signal Ip drive the driving units 158c, 158d of the output circuit 152. Then, the driver module 46 functions as a buffer with a 6×(2×+4×) driving capacity.

With a proper node design for the driving units 158a, 158b, 158c, 158d, the driver module 46 is capable of corresponding to different driving capacities ranging from 1× to 8× for meeting requirements of different circuit structures. It is noteworthy that only 4 driving units 158a, 158b, 158c, 158d and corresponding nodes 154a, 154b, 154c, 154d, 159a, 159b, 159c, 159d are shown in FIG. 6 for simplicity. However, the driver module 46 according to the present invention does not limit the amount of the driving units. That is, the driver module 46 can comprise n driving units to program its driving capacity according to different requirements. Therefore, the application field of the driver module 46 is broadened. In addition, the driving units 158a, 158b, 158c, 158d in the preferred embodiment are inverters. However, any well-known driving circuit can be used to form each driving units 158a, 158b, 158c, 158d for providing desired driving capacities.

Figure 7:
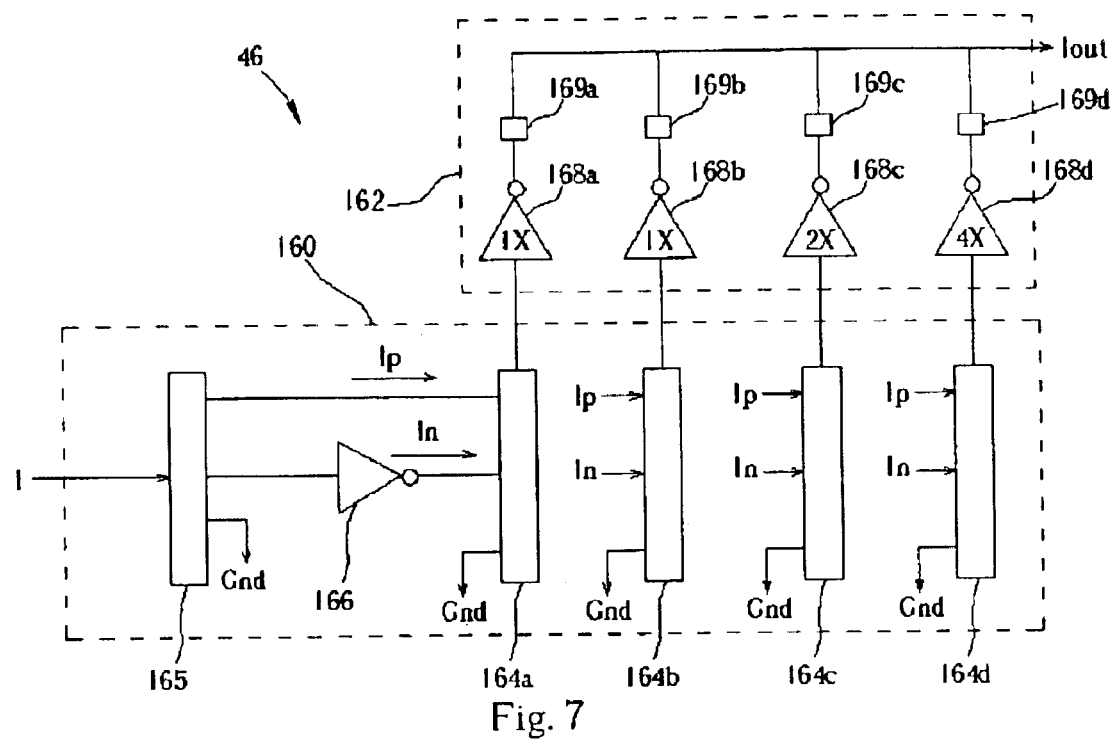
FIG. 7 is a second circuit diagram of the driver module shown in FIG. 4.

Please refer to FIG. 7 in conjunction with FIG. 4. FIG. 7 is a second circuit diagram of the driver module 46 shown in FIG. 4. The driver module 46 has an input circuit 160 and an output circuit 162. The input circuit 160 has a plurality of nodes 164a, 164b, 164c, 164d, 165 and an inverter 166. The node 165 is used to program whether an input signal I is connected to a ground voltage Gnd, the input signal I is connected to the inverter 166 to generate an output signal In, or the input signal I (an output signal Ip for example) is directly inputted into each nodes 164a, 164b, 164c, 164d.

As shown in FIG. 7, the output signal Ip equals the input signal I so that the output signal Ip has the same logic value as the input signal I does. However, the output signal In generated from the inverter 166 has logic values opposite to that of the input signal I. The nodes 164a, 164b, 164c, 164d are respectively used to program whether the output signal In, the output signal Ip, or the ground voltage Gnd is inputted into corresponding driving units 168a, 168b, 168c, 168d of the output circuit 162. In addition, the output circuit 162 further comprises a plurality of nodes 169a, 169b, 169c, 169d used for determining whether the output ports of the corresponding driving units 168a, 168b, 168c, 168d are used to drive an output signal Iout.

The only difference between the driver module 46 shown in FIG. 7 and the driver module 46 shown in FIG. 6 is that the driver module 46 shown in FIG. 6 uses two inverters 156a, 156b to generate the output signals In, Ip. However, the driver module 46 shown in FIG. 7 adopts only one inverter 166 for generating the output signal In, and the desired output signal Ip is obtained through the node 165. In addition, the driver module 46 shown in FIG. 7 and the driver module 46 shown in FIG. 6 correspond to the same operational principle, that is, the output circuits 152, 162 have the same function, and the nodes 154a, 154b, 154c, 154d and the nodes 164a, 164b, 164c, 164d have the same function. The related description for the components of the same name, therefore, is omitted for simplicity.

Please note that the driver module 46 shown in FIG. 7 has no limit on the amount of the driving units. That is, the driver module 46 can comprise n driving units to program its driving capacity according to different requirements. Therefore, the application field of the driver module 46 is broadened. In addition, the driving units 168a, 168b, 168c, 168c in the preferred embodiment are inverters. However, any well-known driving circuit can be used to form each driving units 168a, 168b, 168c, 168c for providing desired driving capacities.

Figure 8:
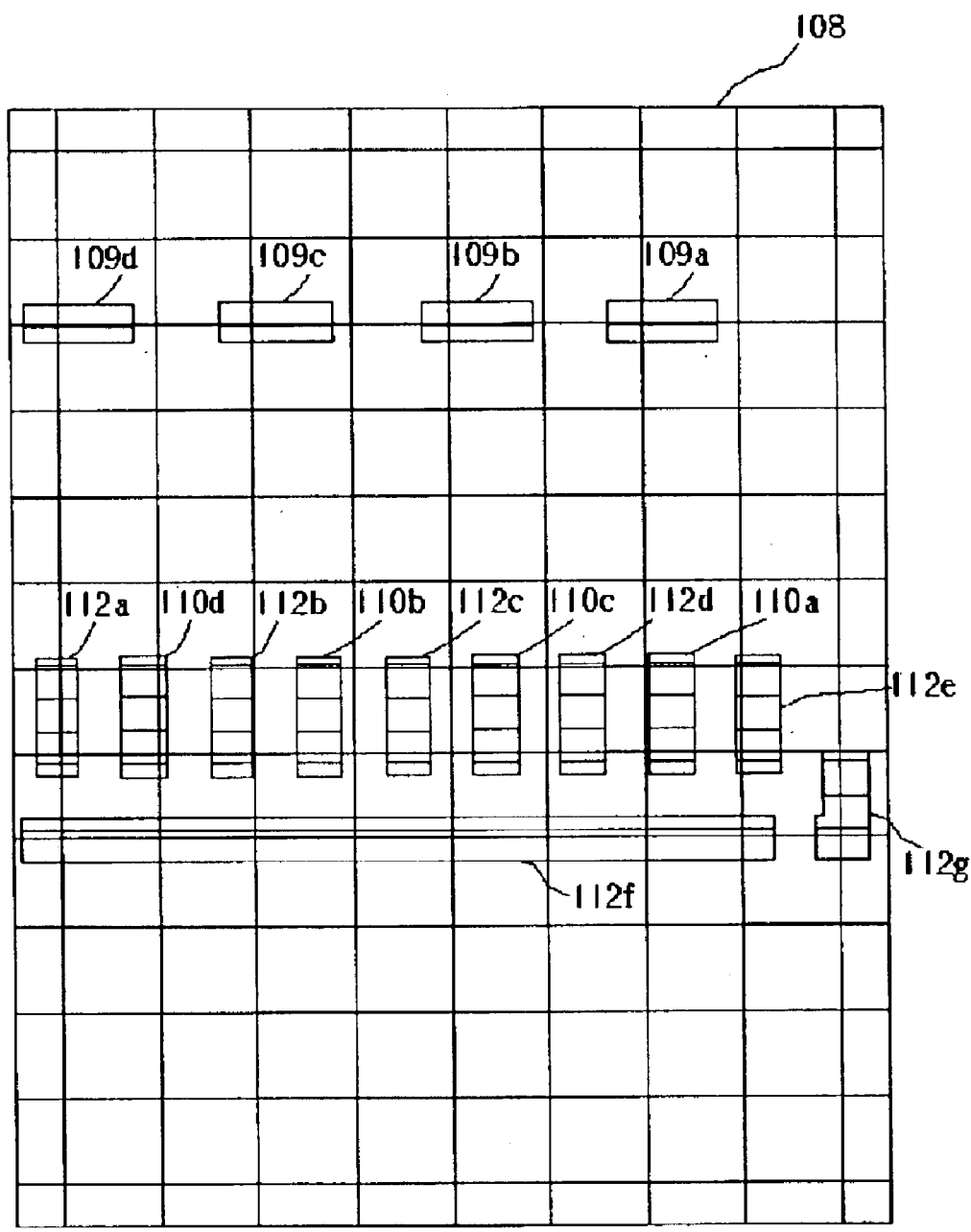
FIG. 8 is a diagram showing a metal layer of the driver module shown in FIG. 6.

Please refer to FIG. 8 in conjunction with FIG. 6. FIG. 8 is a diagram showing a metal layer 108 for the driver module 46 shown in FIG. 6. The metal layer 108 has a plurality of pads 109a, 109b, 109c, 109d, 110a, 110b, 110c, 110d, 112a, 112b, 112c, 112d, 112e, 112f, 112g. The pads 109a, 109b, 109c, 109d respectively correspond to nodes 154a, 154b, 154c, 154d. The pads 112a, 112c, 112e correspond to the output port of the inverter 156a, the pads 112b, 112d correspond to the output port of inverter 156b, the pad 112g is used to receive the input signal I, and the pad 112f corresponds to the ground voltage Gnd.

The integrated circuit designer can use only one photomask to program functions of the driver module 46. For example, the node 154a is used to determine whether the ground voltage Gnd, the output signal Ip, or the output signal In is inputted into the driving unit 158a. Therefore, the pad 110a corresponding to the driving unit 158a can be electrically connected to pad 112d, pad 112e, or pad 112f according to the traces formed by a proper photomask pattern design. Other traces routed for pads 110b, 110c, 110d are similar to select so that the ground voltage Gnd, the output signal Ip, or the output signal In is inputted into corresponding driving units 158b, 158c, 158d. In addition, pads 109a, 109b, 109c, 109d are selectively used for outputting the output signal Iout. According to the nodes 159a, 159b, 159c, 159d shown in FIG. 6, the integrated circuit designer designs the driving capacity of the driver module 46 according whether the pads 109a, 109b, 109c, 109d are used for outputting the output signal Iout.

It is noteworthy that metal layer 108 is a top layer of the driver module 46 pre-fabricated by the semiconductor foundry. The metal layers (not shown) under the metal layer 108 establish partial traces routed among the transistors. That is, the actual function of the driver module 46 is enabled after a photomask pattern is used by a following semiconductor process for programming traces related to each node. In the preferred embodiment, the metal layer 108 only uses four horizontal tracks to position the pads 109a, 109b, 109c, 109d, 110a, 110b, 110c, 110d, 112a, 112b, 112c, 112d, 112e, 112f, 112g. Therefore, the metal layer 108 itself has much room to accommodate other traces routed among the logic operation module 42, the driver module 46, and the storage module 48 of the basic unit 42. In the preferred embodiment, one photomask used to program the metal layer 108 is capable of successfully establishing the actual functionality of the driver module 46. Considering the whole semiconductor process for the semiconductor body 40 according to the present invention, the integrated circuit is fabricated with a greatly reduced photomask cost.

Figure 9:
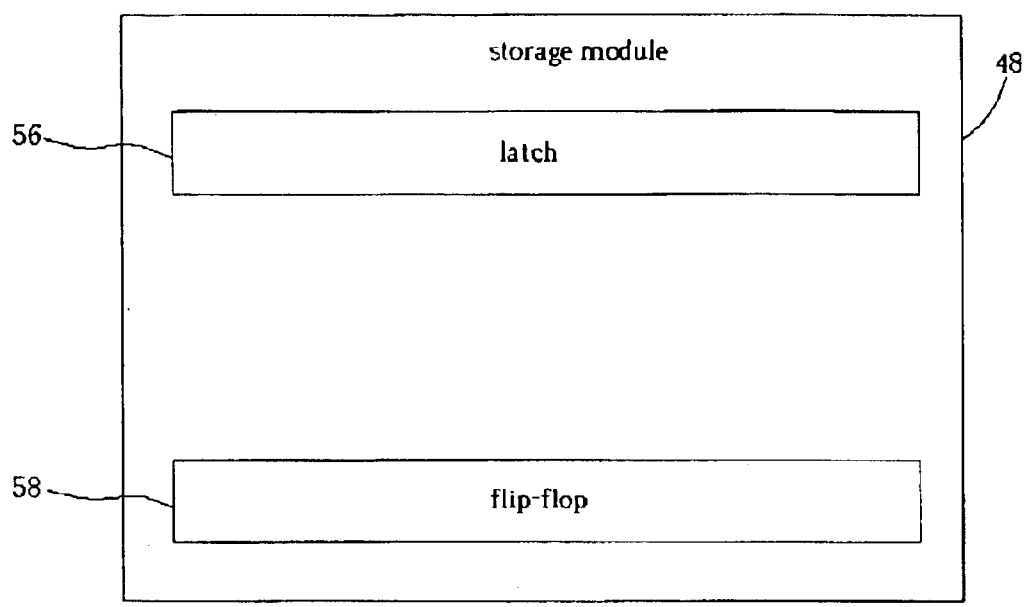
FIG. 9 is a block diagram of a storage module shown in FIG. 4.

Please refer to FIG. 9, which is a block diagram of the storage module 48 shown in FIG. 4. The storage module 48 has a latch 56 and a flip-flop 58, wherein both of the latch 56 and the flip-flop 58 can be used to store data. Similarly, the semiconductor foundry forms transistors and partial traces of the latch 56 and the flip-flop 58 on the storage module 48. Therefore, the integrated circuit designer only designs the photomask pattern to program the storage module 48 to function as either the latch 56 or the flip-flop 58. Therefore, the semiconductor foundry forms an upper metal layer to position the traces required by the correctly functioned latch 56 or the correctly functioned flip-flop 58 according to the photomask pattern. It is well-known that the flip-flop 58 is composed of two latches 56. In other words, the storage module 48 can comprise only two latches 56, and the integrated circuit designer designs the photomask pattern to determine whether these two latches 56 are cascaded to form the above-mentioned flip-flop 58 or only one latch 56 is enabled.

Figure 10:
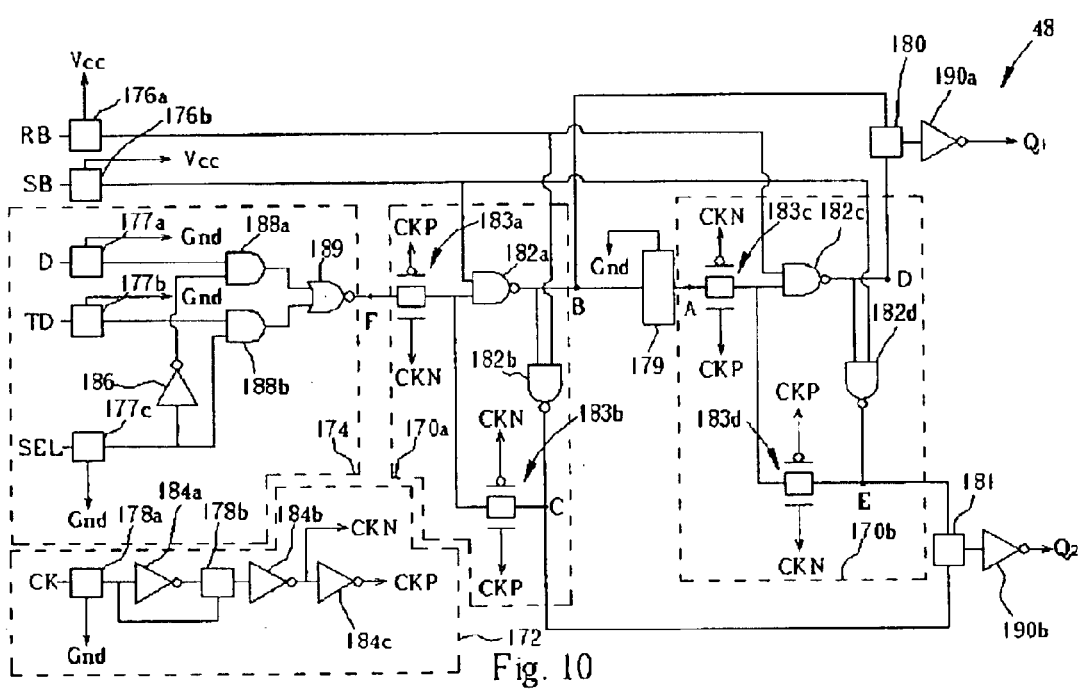
FIG. 10 is a circuit diagram of the storage module shown in FIG. 9.

Please refer to FIG. 10 in conjunction with FIG. 9. FIG. 10 is a circuit diagram of the storage module shown in FIG. 9. The storage module 48 has two latches 170a, 170b, a clock driving circuit 172, a scan circuit 174, and a plurality of nodes 176a, 176b, 177a, 177b, 177c, 178a, 178b, 179, 180, 181. The latch 170a includes two NAND gates 182a, 182b and two transistor switches 183a, 183b (each transistor switch is composed of an NMOS transistor and a PMOS transistor). Similarly, the latch 170b also includes two NAND gates 182c, 182d and two transistor switches 183c, 183d. Please note that the latches 170a, 170b in the preferred embodiment are respectively composed of NAND gates 182a, 182b, 182c, 182d. However, it is well-known that the latch circuit can be form by NOR gates or other types of logic gates. The node 179 is used to determine whether terminal A is electrically connected to the ground voltage Gnd or terminal B. If terminal A is connected to terminal B, the latch 170a and the latch 170b are cascaded to function as a flip-flop. On the other hand, if terminal A is connected to the ground voltage Gnd, the storage module 48 only uses the latch 170a to store data.

In addition, the node 176a is used to determine whether an operating voltage Vcc or a reset signal RB is inputted into the NAND gates 182b, 182c. The node 176b is used to determine whether the operating voltage Vcc or a set signal SB is inputted into the NAND gates 182a, 182d. The reset signal RB and the set signal SB is used to control output ports of the latches 170a, 170b to be a predetermined logic level. Taking the latch 170a for example, if the reset signal RB corresponds to a high logic value "1", and the set signal SB corresponds to a low logic level "0", the latch 170a drives the terminal B to be the high logic level "1", and drives the terminal C to be the low logic level "0". If the reset signal RB corresponds to the low logic value "0", and the set signal SB corresponds to the high logic level "1", the latch 170a drives the terminal B to be the low logic level "0", and drives the terminal C to be the high logic level "1". If the reset signal RB corresponds to the high logic value "1", and the set signal SB corresponds to the high logic level "1", the logic levels at terminals B, C are not altered.

Taking the latch 170b for example, if the reset signal RB corresponds to the high logic value "1", and the set signal SB corresponds to the low logic level "0", the latch 170b drives the terminal E to be the high logic level "1", and drives the terminal D to be the low logic level "0". If the reset signal RB corresponds to the low logic value "0", and the set signal SB corresponds to the high logic level "1", the latch 170b drives the terminal E to be the low logic level "0", and drives the terminal D to be the high logic level "1". If the reset signal RB corresponds to the high logic value "1", and the set signal SB corresponds to the high logic level "1", the logic levels at terminals D, E are not altered.

In the preferred embodiment, the nodes 176a, 176b are used to determine whether the latches 170a, 170b have the function of resetting outputs and setting outputs. That is, if the nodes 176a, 176b are programmed so that the operating voltage Vcc is inputted to both latches 170a, 170b, the latches 170a, 170b do not have the function of resetting outputs and setting outputs.

Within the storage module 48, operational timing of the latch 170a and operational timing of the latch 170b are both controlled by the transistor switches 183a, 183b, 183c, 183d. In other words, when the transistor switches 183a, 183d are turned on, the transistor switches 183b, 183c are turned off. On the other hand, when the transistor switches 183a, 183d are turned off, the transistor switches 183b, 183c are turned on.

For example, suppose that nodes 176a, 176b are programmed to let the reset signal RB and the set signal SB transmitted to the latches 170a, 170b, and that the node 179 is programmed to connect terminal A and terminal B so that the latches 170a, 170b are cascaded to be a flip-flop. When the transistor switches 183a, 183d are turned on during the first period (please note that the transistor switches 183b, 183c are turned off), a first data signal "1" inputted into terminal F drives logic level at terminal B to be "0" through the NAND gate 182a.

When the transistor switches 183b, 183c are turned on during the second period (please note that the transistor switches 183a, 183d are turned off), the loop formed by the NAND gates 182a, 182b holds the logic level "0" at terminal B and the logic level "1" at terminal C. At the same time, the logic level "0" at terminal B is transmitted to the latch 170b, and the NAND gate 182c then drives logic level at terminal D to be "0".

When the transistor switches 183a, 183d are turned on during the third period (please note that the transistor switches 183b, 183c are turned off), a second data signal is inputted into terminal F to drive logic level at terminal B. With regard to the latch 170b, the loop formed by the NAND gates 182c, 182d holds the logic level "1" at terminal D and the logic level "0" at terminal E. Therefore, before the transistor switches 183b, 183c are turned on during the following period, the first data signal "1" is latched at terminal D. As mentioned above, transistor switches 183a, 183b, 183c, 183d dominate overall operation of the storage module 48.

In the preferred embodiment, the clock signals CKP, CKN generated from the clock driving circuit 172 are used to determine whether the transistor switches 183a, 183b, 183c, 183d are turned on or are turned off. The clock driving circuit 172 has nodes 178a, 178b and inverters 184a, 184b, 184c. The node 178a is used to determine whether a reference clock CK or the ground voltage Gnd is inputted into the clock driving circuit 172. The node 178b is used to determine if the latches 170a, 170b correspond to a positive-edge trigger scheme or a negative-edge trigger scheme. For instance, suppose that the node 178a is programmed to let the reference clock CK be inputted into the clock driving circuit 172. When the node 178b is programmed to let the reference clock CK be transmitted directly to the inverter 184b, the control clock CKP and the reference clock CK correspond to the same logic level, and the control clock CKN and the reference clock CK correspond to opposite logic levels individually. Therefore, the transistor switches 183a, 183b, 183c, 183d are respectively turned on according to positive-edge triggers of the reference clock CK. On the other hand, when the node 178b is programmed to connect the inverters 184a, 184b, the control clock CKP and the reference clock CK individually correspond to opposite logic levels, and the control clock CKN and the reference clock CK correspond to the same logic level. Therefore, the transistor switches 183a, 183b, 183c, 183d are respectively turned on according to negative-edge triggers of the reference clock CK.

To sum up, the clock driving circuit 172 can be programmed to make the latches 170a, 170b operate according to the positive-edge triggers of the reference clock CK or the negative-edge triggers of the reference clock CK through appropriate setting of the node 178b.

In addition, the scan circuit 174 can be utilized to test whether the storage module 48 functions correctly. The scan circuit 174 has nodes 1, 77a, 177b, 177c, an inverter 186, AND gates 188a, 188b, and an NOR gate 189. The node 177a is used to determine whether a storage data D or the ground voltage Gnd is inputted into the AND gate 188b. The node 177b is used to determine whether a test data TD or the ground voltage Gnd is inputted into the AND gate 188a. The node 177c is used to determine whether a selection signal SEL or the ground voltage Gnd is inputted into the AND gates 188a, 188b. Therefore, the preferred embodiment determines whether the storage module 48 has a scan function based on design of the nodes 177a, 177b, 177c.

For example, suppose the nodes 177a, 177b, 177c are respectively programmed to let the storage data D, the test data TD, and the selection signal SEL be inputted into AND gates 188a, 188b. When the selection signal SEL corresponds to the logic level "1", one input port of the AND gate 188a corresponds to the logic level "0". Therefore, the output port of the AND gate 188a is certainly forced to hold the logic level "0" so that the inputted storage data D is blocked owing to the fixed logic level "0". On the other hand, when the selection signal SEL corresponds to the logic level "1", one input port of the AND gate 188b corresponds to the logic level "1". Therefore, the test data TD is successfully outputted from the AND gate 188b. The output signals Q1, Q2 are retrieved to see whether the function of the storage module 48 is correct.

When the selection signal SEL corresponds to the logic level "0", one input port of the AND gate 188b corresponds to the logic level "0". Therefore, the output port of the AND gate 188b is certainly forced to hold the logic level "0" so that the inputted test data TD is blocked owing to the fixed logic level "0". On the other hand, when the selection signal SEL corresponds to the logic level "0", one input port of the AND gate 188a correspond to the logic level "1". Therefore, the storage data D is successfully outputted from the AND gate 188a, and the storage data D is stored in the latch 170a or the flip-flop composed of the latches 170a, 170b. However, if nodes 177b, 177c are programmed to let the ground voltage Gnd be inputted into the AND gates 188a, 188b, only the storage data D is allowed to be inputted into the storage module 48. In other words, the storage module 48 does not support the above-mentioned scan function.

It is noteworthy that signal outputted at terminal F has a logic level opposite to the logic level of the corresponding storage data D or the corresponding test data TD. With regard to the flip-flop composed of latches 170a, 170b, the logic level at terminal D is also opposite to the logic level of the corresponding storage data D or the corresponding test data TD, but the logic level at terminal E is identical to the logic level of the corresponding storage data D or the corresponding test data TD.

In the preferred embodiment, when the storage module 48 is designed to function as a flip-flop composed of latches 170a, 170b, and the nodes 180, 181 are programmed to make terminals D, E be two output ports of the latch, the inverters 190a, 190b connected to terminals D, E are placed to make the output signal Q1 have a logic level that is identical to the logic level of the corresponding storage data D or the logic level of the corresponding test data TD, and make the output signal Q2 have a logic level that is opposite to the logic level of the corresponding storage data D or the logic level of the corresponding test data TD.

However, with regard to the latch 170a, the logic level at terminal B is identical to the logic level of the corresponding storage data D or the logic level of the corresponding test data TD, and the logic level at terminal C is opposite to the logic level of the corresponding storage data D or the logic level of the corresponding test data TD. Therefore, when the nodes 180, 181 are programmed to make terminals B, C be two output ports of the latch 170a, the inverters 190a, 190b connected to terminals D, E are used to make the output signal Q1 have a logic level that is opposite to the logic level of the corresponding storage data D or the logic level of the corresponding test data TD, and make the output signal Q2 have a logic level that is identical to the logic level of the corresponding storage data D or the logic level of the corresponding test data TD.

In addition, the scan circuit 174 can also replace the original NOR gate 189 with an OR gate. In other words, no inverter 190a, 190b is needed to be connected to the output port for adjusting the final logic levels of the output signals Q1, Q2. In the preferred embodiment, the scan circuit 174 adopts AND gates 188a, 188b and the NOR gate 189 to implement a combinational logic operation used to control activation of the scan function. However, the scan circuit 174 is also capable of utilizing any combination of logical operations implemented by other logic gates to control activation of the scan function. Because the driver module 46 as mentioned above is capable of balancing clock signals, the storage module 46 according to the present invention is capable of being positioned in each basic unit 42.

Figure 11:
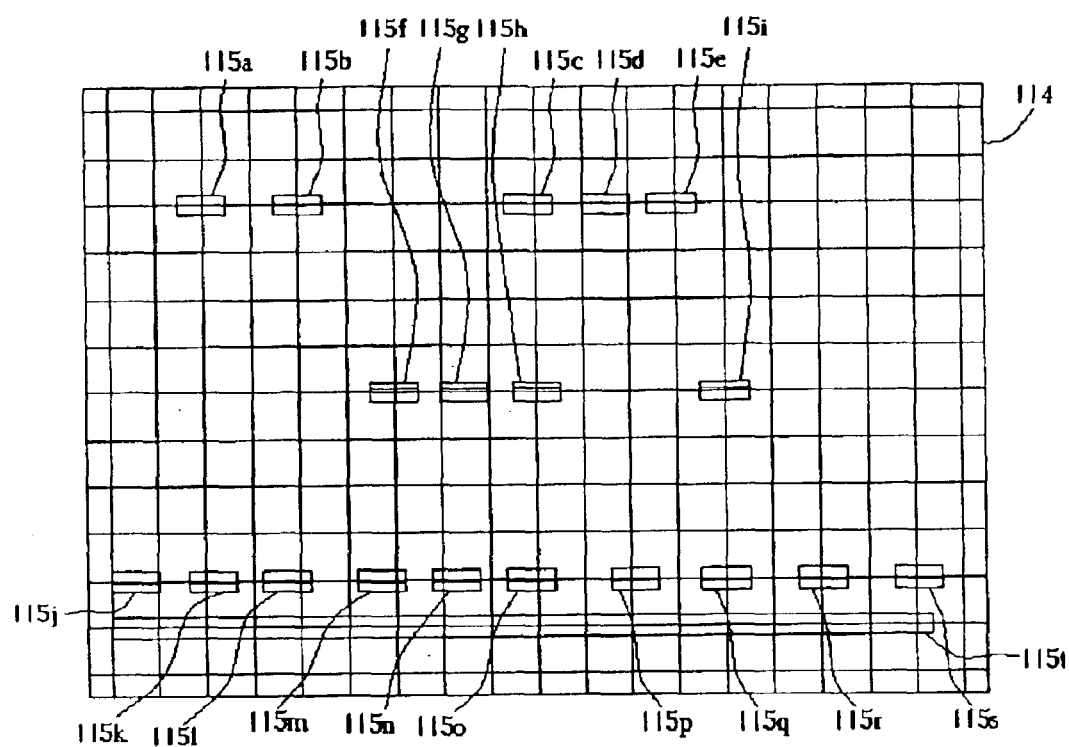
FIG. 11 is diagram showing a metal layer of the storage module shown in FIG. 10.

Please refer to FIG. 11 in conjunction with FIG. 10. FIG. 11 is diagram showing a metal layer 114 of the storage module shown in FIG. 10. The metal layer 114 has a plurality of pads 115a, 115b, 115c, 115d, 115e, 115f, 115g, 115h, 115i, 115j, 115k, 115l, 115m, 115n, 115o, 115p, 115q, 115r, 115s, 115t. Pads 115a, 115b are used to be output ports for respectively outputting the output signal Q2 and the output signal Q1. The pad 115t is used to receive the ground voltage Gnd. The pads 115c, 115e respectively correspond to the nodes 176a, 176b shown in FIG. 10. The pad 115d is used to receive the operating voltage Vcc. Therefore, the integrated circuit designer can use one photomask to define traces routed between the pads 115c, 115e and the pad 115d to decide whether the reset signal RB and the set signal SB are delivered to corresponding latches 170a, 170b.

The pad 115g corresponds to the node 180 shown in FIG. 10, and the pads 115f, 115h respectively correspond to terminals D, B shown in FIG. 10. Therefore, the integrated circuit designer can use one photomask to define traces routed between the pad 115g and pads 115f, 115h to decide whether terminal B or terminal D is used.

The pad 115j corresponds to the node 178a shown in FIG. 10. The pad 115j is used to receive the reference clock CK, or is used to connect the pad 115t to receive the ground voltage Gnd. Therefore, the pad 115j is used to determine whether the reference clock CK or the ground voltage Gnd is inputted into the clock driving circuit 172 shown in FIG. 10. The pad 115l corresponds to the output port of the inverter 184a shown in FIG. 10, and the pad 115k corresponds to the node 178b shown in FIG. 10. Therefore, the integrated circuit designer can use one photomask to determine that the latches 170a, 170b work according to positive-edge triggers or negative-edge triggers of the reference clock CK through routing a trace between the pads 115k, 115j or between the pads 115k, 115l.

The pad 115n corresponds to the node 181 shown in FIG. 10, and pads 115m, 115o respectively correspond terminals E, C shown in FIG. 10. Therefore, the integrated circuit designer can utilize one photomask to plan traces routed between the pad 115n and the pads 115m, 115o to determine whether terminal E or terminal C is used.

The pads 115i, 115p both correspond to the node 179 shown in FIG. 10, and are used to determine whether terminal A is connected to the ground voltage Gnd (pad 115t) or terminal B (pad 115h). The remaining pads 115q, 115r, 115s respectively correspond to nodes 177b, 177c, 177a for receiving the test data TD, the selection signal SEL, the storage data D. On the other hand, the pads 115q, 115r, 115s can be programmed to receive the ground voltage Gnd (pad 115t).

Please note that the metal layer 144 is the top layer of the storage module 48 that is a half-finished product pre-formed by the semiconductor foundry. The layers (not shown) under the metal layer 114 are used to form partial traces among transistors. That is, the correct function of the storage module is fully activated after a photomask defining traces routed among the nodes is applied upon the half-finished product through a following semiconductor process.

In the preferred embodiment, the metal layer 114 only requires 4 horizontal tracks to position the pads 115a, 115b, 115c, 115d, 115e, 115f, 115g, 115h, 115i, 115j, 115k, 115l, 115m, 115n, 115o, 115p, 115q, 115r, 115s, 115t. Therefore, the metal layer 114 can have greater routing space left to place additional traces routed among the logic operation module 44, the driver module 46, and the storage module 48. In addition, the preferred embodiment needs only one photomask to place the desired traces used for defining the function of the storage module 48. With regard to the whole semiconductor process for the semiconductor body 40 according to the present invention, the integrated circuit is fabricated with a greatly reduced photomask cost. It is noteworthy that the basic unit 42 shown in FIG. 4 only includes a driver module 46 and a storage module 48. However, a plurality of driver modules 46 and a plurality of storage modules 48 can be located in the same basic unit 42 so that the integrated circuit designer is capable of programming the basic unit 42 to support a complicated operation.

In contrast to the prior art semiconductor body, the claimed semiconductor body of an integrated circuit has a plurality of basic units, and each basic unit has at least a driver module that is capable of being programmed to function as a clock driver for adjusting timing of clock signals. That is, the integrated circuit designer programs the driver module to eliminate the prior art clock skew. Therefore, the amount of clock sources used by the integrated circuit, which is fabricated based on the claimed semiconductor body, is not limited. The claimed semiconductor body is capable of being applied to design any integrated circuit so that the claimed semiconductor body corresponds to greater design flexibility and a broad application field.

In addition, after the integrated circuit designer defines hardware specifications of the integrated circuit through the hardware description language (HDL), the integrated circuit designer can use prior art synthesis tools to generate a circuit diagram related to the electronic components of the integrated circuit. Then, the prior art placement & routing tool is used to allocate the electronic components and is used to place traces routed among the electronic components. The claimed semiconductor body is fully compatible with the above-mentioned design flow.

In addition, within the claimed semiconductor body, the driver module and storage module of each basic unit already have conductive traces to form simple electronic components. For example, the driver module has a buffer, an inverter, and a gain unit. Therefore, the integrated circuit designer uses fewer photomask pattern layouts (only one photomask for instance) on the claimed semiconductor body to define traces required to connect the existing simple electronic components to activate workable functions of the driver module and the storage module.

The claimed semiconductor body uses a semiconductor process to form basic units in advance. Because the basic units have been verified to work correctly, the integrated circuit designer does not need to consider the fabrication risk about manufacturing electronic components required by the integrated circuit. Therefore, the integrated circuit designer can utilize the claimed semiconductor body to quickly develop the prototype system. With subsequent system verification and system debugging, the overall time-to-market is greatly shortened. Moreover, the integrated circuit requires fewer photomasks to implement traces on the claimed semiconductor body. The photomask cost for the integrated circuit is also greatly reduced.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for forming an integrated circuit, the integrated circuit comprising a semiconductor body, the method comprising:

(a) forming at least a logic operation module, at least a driver module, and at least a storage module within each of a plurality of basic units positioned on the semiconductor body; and (b) after performing step (a), forming a metal layer upon the semiconductor body for programming the logic operation module to be capable of performing a predetermined logic operation, for programming the driver module to be capable of driving input signals inputted into the driver module, and for programming the storage module to be capable of storing data.

2. The method of claim 1 wherein the step of forming the driver module comprises:

positioning an input circuit, and positioning an output circuit, the output circuit comprising a plurality of driving units respectively used for outputting a driving current to drive a voltage level at an output port of the output circuit.

3. The method of claim 2 wherein the step of programming the driver module comprises:

controlling the input circuit used for receiving the input signals or electrically connecting a predetermined voltage level.

4. The method of claim 3 wherein the step of programming the driver module further comprises:

controlling an input port of each driving unit electrically connected to either an output port of the input circuit or the predetermined voltage level.

5. The method of claim 3 wherein the input circuit comprises an inverter being capable of receiving the input signals and inverting logic values of the input signals to generate corresponding output signals, and the step of programming the driver module further comprises:

controlling an input port of each driving unit for receiving the input signals, for receiving the output signals, or be electrically connected to the predetermined voltage level.

6. The method of claim 3 wherein the input circuit comprises a first inverter and a second inverter, an input port of the second inverter is electrically connected to an output port of the first inverter, and the step of programming the driver module further comprises:

controlling the first inverter for either receiving the input signals or for being electrically connected to the predetermined voltage level; and controlling an input port of each driving unit electrically connected to the output port of the first inverter, an output port of the second inverter, or the predetermined voltage level.

7. The method of claim 3 wherein the predetermined voltage level is a ground voltage.

8. The method of claim 1 wherein the step of programming the driver module comprises:

controlling an output port of each driving unit for selectively connecting to one of a plurality of output ports of the driver module for determining driving capability of the driver module.

9. The method of claim 1 wherein the driver module is an inverter.

10. The method of claim 1 wherein the driver module is a buffer.

11. The method of claim 1 wherein the step of forming the storage module comprises:

positioning a first latch for receiving an input data;
positioning a second latch; and
positioning a clock driving circuit for controlling operation of the first latch and the second latch.

12. The method of claim 11 wherein the step of programming the storage module comprises:

controlling the first latch connected to the second latch for forming a flip-flop to store the input data.

13. The method of claim 11 wherein the step of programming the storage module comprises:

controlling the first latch to keep disconnected from the second latch for only using the first latch to store the input data.

14. The method of claim 11 wherein the clock driving circuit is used for receiving a reference clock and generating a first driving clock and a second driving clock according to the reference clock to respectively control timing of the first latch and the second latch, the first driving clock and the reference clock are in phase, and the second driving clock and the reference clock are out of phase.

15. The method of claim 14 wherein the step of programming the storage module comprises:

controlling an input port of the clock driving circuit electrically connected to either the reference clock or a predetermined voltage level.

16. The method of claim 15 wherein the step of forming the storage module further comprises:

positioning a scan circuit for selectively outputting a test data or the input data into the first latch.

17. The method of claim 16 wherein the step of programming the storage module further comprises:

controlling a first input port of the scan circuit either for receiving the input data or electrically connecting to the predetermined voltage level;

controlling a second input port of the scan circuit either for receiving the test data or electrically connecting to the predetermined voltage level; and controlling a third input port of the scan circuit either connected to the predetermined voltage level or for receiving a selection signal used to determine whether the input data received by the first input port or the test data received by the second input port is adopted.

18. The method of claim 15 wherein the predetermined voltage level is a ground voltage.

19. The method of claim 11 wherein the step of programming the storage module comprises:

controlling whether a reset signal is inputted into the first latch and the second latch for resetting output ports of the first latch and the second latch to be a first logic value or whether a predetermined voltage level is inputted to the first latch and the second latch; and controlling whether a set signal is inputted into the first latch and the second latch for setting output ports of the first latch and the second latch to be a second logic value or whether the predetermined voltage level is inputted to the first latch and the second latch.

20. The method of claim 19 wherein the predetermined voltage level is an operating voltage.

21. An integrated circuit implementing the method of claim 1.

22. A method for forming an integrated circuit, the integrated circuit comprising a semiconductor body, the method comprising:

(a) forming at least a logic operation module and at least a driver module within each of a plurality of basic units positioned on the semiconductor body; and (b) after performing step (a), forming a metal layer upon the semiconductor body for programming the logic operation module to be capable of performing a predetermined logic operation, and for programming the driver module to be capable of eliminating the clock skew of input signals inputted into the driver module.

23. The method of claim 22 wherein step (a) further comprises forming at least a storage module within each of the basic units; and step (b) further comprises forming the metal layer for programming the storage module to be capable of storing data.

24. A method for forming an integrated circuit, the integrated circuit comprising a semiconductor body, the method comprising:

(a) forming at least a logic operation module and at least a storage module within each of a plurality of basic units positioned on the semiconductor body; and (b) after performing step (a), forming a metal layer upon the semiconductor body for programming the logic operation module to be capable of performing a predetermined logic operation, and for programming the storage module to be capable of storing data.

25. A method for forming an integrated circuit, the integrated circuit comprising a semiconductor body, the method comprising:

(a) forming at least a driver module and at least a storage module within each of a plurality of basic units positioned on the semiconductor body; and (b) after performing step (a), forming a metal layer upon the semiconductor body for programming the driver module to be capable of driving input signals inputted into the driver module, and for programming the storage module to be capable of storing data.

* * * * *